(12) United States Patent
Delano et al.

(10) Patent No.: US 11,496,096 B2
(45) Date of Patent: Nov. 8, 2022

(54) AMPLIFIER SWITCHING CONTROL SYSTEMS AND METHODS

(71) Applicant: Maxim Integrated Products, Inc., San Jose, CA (US)

(72) Inventors: Cary Delano, Los Altos, CA (US); Doug Heineman, Austin, TX (US); Graeme Docherty, Austin, TX (US); Feng Yu, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 285 days.

(21) Appl. No.: 16/874,857

(22) Filed: May 15, 2020

(65) Prior Publication Data

US 2020/0382063 A1 Dec. 3, 2020

Related U.S. Application Data

(60) Provisional application No. 62/853,821, filed on May 29, 2019.

(51) Int. Cl.
| | |
|---|---|
| *H03F 3/38* | (2006.01) |
| *H03F 1/02* | (2006.01) |
| *H03F 3/187* | (2006.01) |
| *H03F 3/217* | (2006.01) |

(52) U.S. Cl.
CPC .......... *H03F 1/0211* (2013.01); *H03F 3/187* (2013.01); *H03F 3/217* (2013.01); *H03F 3/38* (2013.01); *H03F 2200/03* (2013.01); *H03F 2200/33* (2013.01); *H03F 2200/351* (2013.01)

(58) Field of Classification Search
CPC .... H03F 1/0211; H03F 3/187; H03F 2200/03; H03F 2200/33; H03F 2200/351; H03F 2200/331; H03F 3/2173; H03F 3/3081; H03F 1/3217; H03F 3/217
USPC .............................. 330/10, 146, 207 A, 251
See application file for complete search history.

(56) References Cited

U.S. PATENT DOCUMENTS

| | | | |
|---|---|---|---|
| 5,513,094 A | 4/1996 | Stanley | |
| 6,038,142 A * | 3/2000 | Fraidlin | H02M 3/3372 363/17 |
| 8,319,486 B2 * | 11/2012 | Maksimovic | H02M 3/157 323/283 |
| 8,421,430 B2 * | 4/2013 | Sasaki | H02M 3/157 323/283 |
| 8,674,620 B2 * | 3/2014 | Capodivacca | H05B 45/39 315/307 |
| 8,749,215 B2 | 6/2014 | Hester | |
| 8,773,196 B2 | 7/2014 | Delano | |

(Continued)

*Primary Examiner* — Khanh V Nguyen

(57) ABSTRACT

A first module is configured to, based on an input sample, determine a first duty cycle. A second module is configured to, based on a battery voltage and the first duty cycle, determine a second duty cycle. A third module is configured to: set a scalar value based on at least one of a battery current, an amplitude of the input sample, the second duty cycle, and an output voltage; and generate a start signal at a rate equal to a predetermined rate multiplied by the scalar value. A fourth module is configured to set a third duty cycle based on the second duty cycle and the scalar value. A fifth module is configured to generate a PWM output based on the start signal and the third duty cycle. A sixth module is configured to apply power to gates of FETs of a voltage converter based on the PWM output.

20 Claims, 16 Drawing Sheets

(56) References Cited

U.S. PATENT DOCUMENTS

| | | |
|---|---|---|
| 8,995,691 B2 | 3/2015 | French et al. |
| 9,564,862 B2 | 2/2017 | Hoyerby |
| 10,186,970 B2 * | 1/2019 | Fay ................... H03F 1/0233 |
| 10,528,023 B2 * | 1/2020 | Steinbach ............ H02P 25/03 |
| 2015/0365002 A1 | 12/2015 | Cao et al. |

* cited by examiner

AMPLIFIER SWITCHING CONTROL SYSTEMS AND METHODS

CROSS-REFERENCE TO RELATED APPLICATIONS

This application claims the benefit of U.S. Provisional Application No. 62/853,821, filed on May 29, 2019. The entire disclosure of the application referenced above is incorporated herein by reference.

FIELD

The present disclosure relates to amplifiers and more particularly to control systems and methods for controlling clocking frequency of switches of amplifiers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Various types of electronic circuits use analog and digital signals. An analog to digital converter (ADC) may be implemented to convert an analog signal into a digital signal that can be used by one or more digital components. A digital to analog converter (DAC) may be implemented to convert a digital signal into an analog signal that can be used by one or more analog components.

For example, a portable device that outputs sound ("a portable audio device") includes a DAC. The DAC receives a digital signal that is, for example, pulse density modulated (PDM) or pulse code modulated (PCM). The DAC generates an analog signal based on the digital signal. An amplifier drives one or more speakers of the portable audio device based on the analog signal to produce sound.

SUMMARY

In a feature, an amplifier system includes: a voltage converter including at least one of: a buck converter; and a boost converter; a sigma delta modulator module configured to, based on an input sample, determine a first duty cycle for switching field effect transistors (FETs) of the voltage converter; a duty cycle module configured to, based on a battery voltage and the first duty cycle, determine a second duty cycle for switching the FETs of the voltage converter; a start and clock module configured to: set a scalar value to one of 1, 2, and 4 based on at least one of a battery current, an amplitude of the input sample, the second duty cycle, and an output voltage of the voltage converter; and generate a start signal at a rate equal to a predetermined rate multiplied by the scalar value; a FET switch rate module configured to set a third duty cycle to: the second duty cycle when the scalar value is set to 1; the second duty cycle divided by 2 when the scalar value is set to 2; and the second duty cycle divided by 4 when the scalar value is set to 4; a digital pulse width modulation (DPWM) module configured to generate a pulse width modulation (PWM) output for switching of the FETs of the voltage converter based on the start signal and the third duty cycle; and a gate drive module configured to apply power to gate terminals of the FETs of the voltage converter based on the PWM output.

In further features, the start and clock module is configured to set the scalar value to 1 when all of: the battery current is less than a predetermined current; the amplitude of the input sample is less than a predetermined voltage; and the second duty cycle is less than a predetermined duty cycle.

In further features, the start and clock module is configured to set the scalar value to 2 when the battery current is greater than the predetermined current.

In further features, the start and clock module is configured to set the scalar value to 4 when the battery current is greater than a second predetermined current that is greater than the predetermined current.

In further features, the start and clock module is configured to transition the scalar value from 2 to 1 when the battery current transitions from greater than a second predetermined current to less than the second predetermined current, wherein the second predetermined current is less than the predetermined current.

In further features, the start and clock module is configured to set the scalar value to 2 when the amplitude of the input sample is greater than the predetermined voltage.

In further features, the start and clock module is configured to set the scalar value to 4 when the amplitude of the input sample is greater than a second predetermined voltage that is greater than the predetermined voltage.

In further features, the start and clock module is configured to transition the scalar value from 2 to 1 when the amplitude of the input sample transitions from greater than a second predetermined voltage to less than the second predetermined voltage, wherein the second predetermined voltage is less than the predetermined voltage.

In further features, the start and clock module is configured to set the scalar value to 2 when the second duty cycle is greater than the predetermined duty cycle.

In further features, the start and clock module is configured to set the scalar value to 4 when the second duty cycle is greater than a second predetermined duty cycle that is greater than the predetermined duty cycle.

In further features, the start and clock module is configured to transition the scalar value from 2 to 1 when the second duty cycle transitions from greater than a second predetermined duty cycle to less than the second predetermined duty cycle, wherein the second predetermined duty cycle is less than the predetermined duty cycle.

In further features, the start and clock module is configured to set the scalar value based on all of the battery current, the amplitude of the input sample, and the second duty cycle.

In further features, the start and clock module is configured to transition the scalar value from 1 to 2 when at least one of: the battery current is greater than a first predetermined current; the amplitude of the input sample is greater than a first predetermined voltage; and the second duty cycle is greater than a first predetermined duty cycle.

In further features, the start and clock module is configured to transition the scalar value from 2 to 4 when at least one of: the battery current is greater than a second predetermined current that is greater than the first predetermined current; the amplitude of the input sample is greater than a second predetermined voltage that is greater than the first predetermined voltage; and the second duty cycle is greater than a second predetermined duty cycle that is greater than the first predetermined duty cycle.

In further features, the amplifier system includes a speaker and an H-bridge configured to receive output from the voltage converter and to apply power to the speaker.

In further features, the DPWM module is configured to first transition the PWM output from OFF to ON when the start signal is generated, maintain the PWM output ON for a period corresponding to the third duty cycle after the first transition, and transition the PWM output from to ON to OFF when the period has passed.

In a feature, an audio amplifier system includes: a speaker; a voltage converter including at least one of: a buck converter; and a boost converter; an H-bridge configured to receive power output by the voltage converter and to apply power to the speaker; a control module configured to set a switching rate for field effect transistors (FETs) of the voltage converter based on a scalar multiplied by a predetermined rate and to selectively set the scalar to a value that is greater than one based on one or more operating parameters; a digital pulse width modulation (DPWM) module configured to generate a pulse width modulation (PWM) output for switching of the FETs of the voltage converter based on the switching rate; and a gate drive module configured to apply power to gate terminals of the FETs of the voltage converter based on the PWM output.

In further features, the control module is configured to increase the scalar away from one as a battery current increases.

In further features, the control module is configured to increase the scalar away from one as an amplitude of an input sample increases.

In further features, the control module is configured to determine a duty cycle for switching the FETs of the voltage converter and to increase the scalar away from one as the duty cycle increases.

In further features, the control module is configured to decrease the scalar toward or to one as a battery current decreases.

In further features, the control module is configured to decreases the scalar toward or to one as an amplitude of an input sample decreases.

In further features, the control module is configured to determine a duty cycle for switching the FETs of the voltage converter and to decreases the scalar toward or to one as the duty cycle decreases.

In a feature, an amplifier control method includes: based on an input sample, determining a first duty cycle for switching field effect transistors (FETs) of a voltage converter, the voltage converter including at least one of: a buck converter; and a boost converter; based on a battery voltage and the first duty cycle, determining a second duty cycle for switching the FETs of the voltage converter; setting a scalar value to one of 1, 2, and 4 based on at least one of a battery current, an amplitude of the input sample, the second duty cycle, and an output voltage of the voltage converter; generating a start signal at a rate equal to a predetermined rate multiplied by the scalar value; setting a third duty cycle to: the second duty cycle when the scalar value is set to 1; the second duty cycle divided by 2 when the scalar value is set to 2; and the second duty cycle divided by 4 when the scalar value is set to 4; generating a pulse width modulation (PWM) output for switching of the FETs of the voltage converter based on the start signal and the third duty cycle; and applying power to gate terminals of the FETs of the voltage converter based on the PWM output.

In further features, setting the scalar value includes setting the scalar value to 1 when all of: the battery current is less than a predetermined current; the amplitude of the input sample is less than a predetermined voltage; and the second duty cycle is less than a predetermined duty cycle.

In further features, setting the scalar value includes setting the scalar value to 2 when the battery current is greater than the predetermined current.

In further features, setting the scalar value includes setting the scalar value to 4 when the battery current is greater than a second predetermined current that is greater than the predetermined current.

In further features, setting the scalar value includes transitioning the scalar value from 2 to 1 when the battery current transitions from greater than a second predetermined current to less than the second predetermined current, wherein the second predetermined current is less than the predetermined current.

In further features, setting the scalar value includes setting the scalar value to 2 when the amplitude of the input sample is greater than the predetermined voltage.

In further features, setting the scalar value includes setting the scalar value to 4 when the amplitude of the input sample is greater than a second predetermined voltage that is greater than the predetermined voltage.

In further features, setting the scalar value includes transitioning the scalar value from 2 to 1 when the amplitude of the input sample transitions from greater than a second predetermined voltage to less than the second predetermined voltage, where the second predetermined voltage is less than the predetermined voltage.

In further features, setting the scalar value includes setting the scalar value to 2 when the second duty cycle is greater than the predetermined duty cycle.

In further features, setting the scalar value includes setting the scalar value to 4 when the second duty cycle is greater than a second predetermined duty cycle that is greater than the predetermined duty cycle.

In further features, setting the scalar value includes transitioning the scalar value from 2 to 1 when the second duty cycle transitions from greater than a second predetermined duty cycle to less than the second predetermined duty cycle, wherein the second predetermined duty cycle is less than the predetermined duty cycle.

In further features, setting the scalar value includes setting the scalar value based on all of the battery current, the amplitude of the input sample, and the second duty cycle.

In further features, setting the scalar value includes transitioning the scalar value from 1 to 2 when at least one of: the battery current is greater than a first predetermined current; the amplitude of the input sample is greater than a first predetermined voltage; and the second duty cycle is greater than a first predetermined duty cycle.

In further features, setting the scalar value includes transitioning the scalar value from 2 to 4 when at least one of: the battery current is greater than a second predetermined current that is greater than the first predetermined current; the amplitude of the input sample is greater than a second predetermined voltage that is greater than the first predetermined voltage; and the second duty cycle is greater than a second predetermined duty cycle that is greater than the first predetermined duty cycle.

In further features, the amplifier control method further includes applying power output from the voltage converter to a speaker via an H-bridge.

In further features, generating the PWM output includes: first transitioning the PWM output from OFF to ON when the start signal is generated; maintaining the PWM output ON for a period corresponding to the third duty cycle after the first transition; and transitioning the PWM output from to ON to OFF when the period has passed.

In a feature, an audio amplifier control method includes: applying power output by a voltage converter to a speaker via an H-bridge, the voltage converter including at least one of: a buck converter; and a boost converter; setting a switching rate for field effect transistors (FETs) of the voltage converter based on a scalar multiplied by a predetermined rate; selectively setting the scalar to a value that is greater than one based on one or more operating parameters; generating a pulse width modulation (PWM) output for switching of the FETs of the voltage converter based on the switching rate; and applying power to gate terminals of the FETs of the voltage converter based on the PWM output.

In further features, selectively setting the scalar to a value that is greater than one includes increasing the scalar away from one as a battery current increases.

In further features, selectively setting the scalar to a value that is greater than one includes increasing the scalar away from one as an amplitude of an input sample increases.

In further features, the audio amplifier control system further includes determining a duty cycle for switching the FETs of the voltage converter, where selectively setting the scalar to a value that is greater than one includes increasing the scalar away from one as the duty cycle increases.

In further features, the audio amplifier control system further includes decreasing the scalar toward or to one as a battery current decreases.

In further features, the audio amplifier control system further includes decreasing the scalar toward or to one as an amplitude of an input sample decreases.

In further features, the audio amplifier control system further includes: determining a duty cycle for switching the FETs of the voltage converter; and decreasing the scalar toward or to one as the duty cycle decreases.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Examples of amplifiers include audio amplifiers, piezo amplifiers, piezo drivers, motor drivers, and other types of switching amplifiers. Some amplifiers apply power from a battery or a direct current (DC) to DC converter to one or more speakers or another type of load. Some amplifiers operate in a buck mode where the amplifier receives a first voltage and outputs a second voltage that is less than the first voltage. Other amplifiers operate in a boost mode where the amplifier receives a first voltage and outputs a second voltage that is greater than the first voltage.

Some amplifiers operate in the boost mode at some times and in the buck mode at other times. More specifically, some amplifiers receive a first voltage, output a second voltage that is less than the first voltage (and operate in a buck mode) under some conditions, and output a third voltage that is greater than the first voltage (and operate in a boost mode) under other conditions. This type of amplifier may be referred to as a buck-boost amplifier.

According to the present application, a control module selectively scales a switching frequency of field effect transistors (FETs) of a converter based on one or more operating parameters, such as battery current, duty cycle, and amplitude of an input signal. The converter may be a buck converter, a boost converter, or a combination buck-boost converter. The control module also scales the duty cycle to be applied to the FETs based on the scaling of the switching frequency. The scaling reduces peak to peak current ripple and increases performance (e.g., output power) of the converter.

Figure 1:
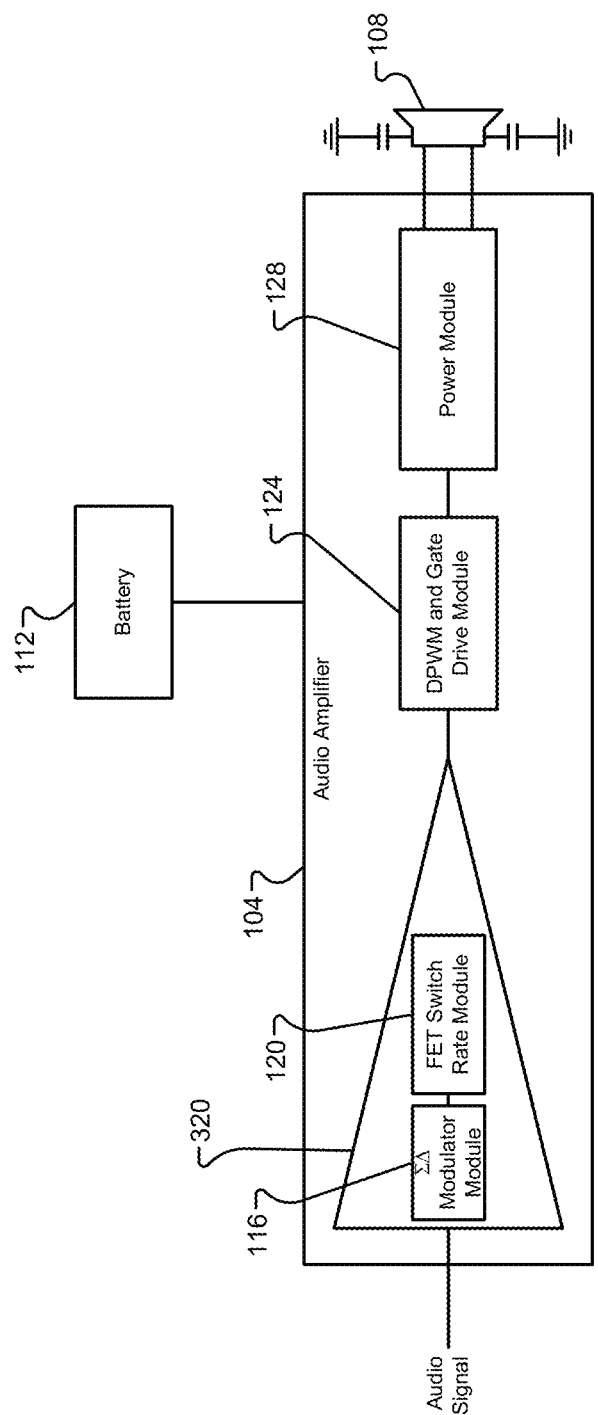
FIG. 1 is a high level functional block diagram of an example audio amplifier 104, such as of a portable audio device.

FIG. 1 is a high level functional block diagram of an example audio amplifier 104, such as of a portable audio device. The audio amplifier 104 receives an audio input signal (audio signal). The audio input signal may be an analog signal or a digital signal. The audio input signal may be generated, for example, based on an audio file stored in computer readable medium or received from a transceiver. The audio amplifier 104 applies power to one or more speakers, such as speaker 108, from a battery 112 based on the audio input signal to output sound corresponding to the audio input signal. The audio amplifier 104 includes a Sigma-Delta (IA) modulator module 116, a field effect transistor (FET) switch rate module 120, a digital pulse width modulation (DPWM) and gate drive module 124, and a power module 128.

Figure 2:
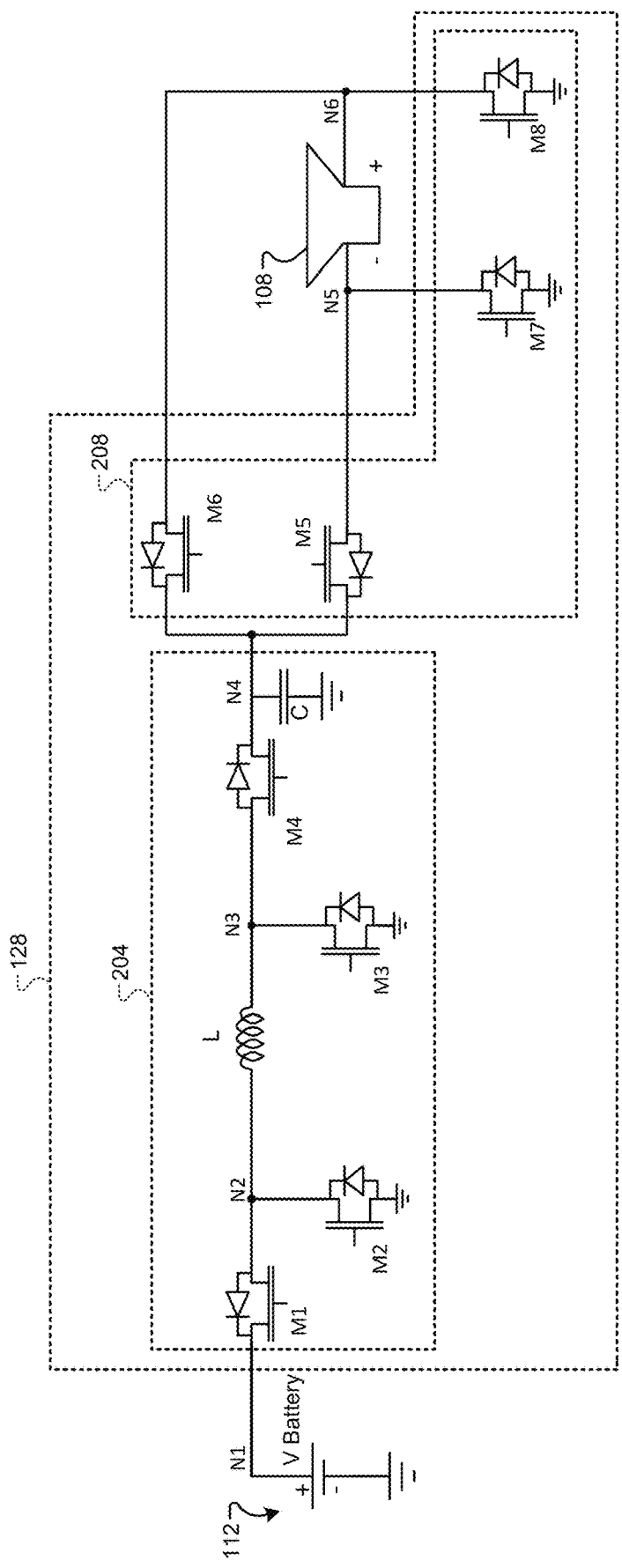
FIG. 2 is a schematic including an example implementation of a power module.

FIG. 2 is a schematic including an example implementation of the power module 128. The power module includes a buck-boost converter 204 and an H-bridge 208. The buck-boost converter 204 includes a first FET M1, a second FET M2, a third FET M3, a fourth FET M4, an inductor L, and a capacitor C. The first and second FETs M1 and M2 (along with the inductor L and the capacitor C) form a buck converter. The third and fourth FETs M3 and M4 (along with the inductor L and the capacitor C) form a boost converter. The ON/OFF times of the first, second, third, and fourth FETS M1, M2, M3, and M4 dictate the voltage at node N4.

The H-bridge 208 includes fifth, sixth, seventh, and eighth FETs M5, M6, M7, and M8. The ON/OFF times of the fifth, sixth, seventh, and eighth FETs M5, M6, M7, and M8 control the application of power to the speaker 108 (via nodes N5 and N6) from the buck-boost converter 204 (node N4).

The buck-boost converter illustrated in FIG. 2 is a pulsed voltage converter. While the converter is in buck mode, the first and second FETs M1 and M2 are switching. While in boost mode, the third and fourth FETs M3 and M4 are switching.

Figure 3:
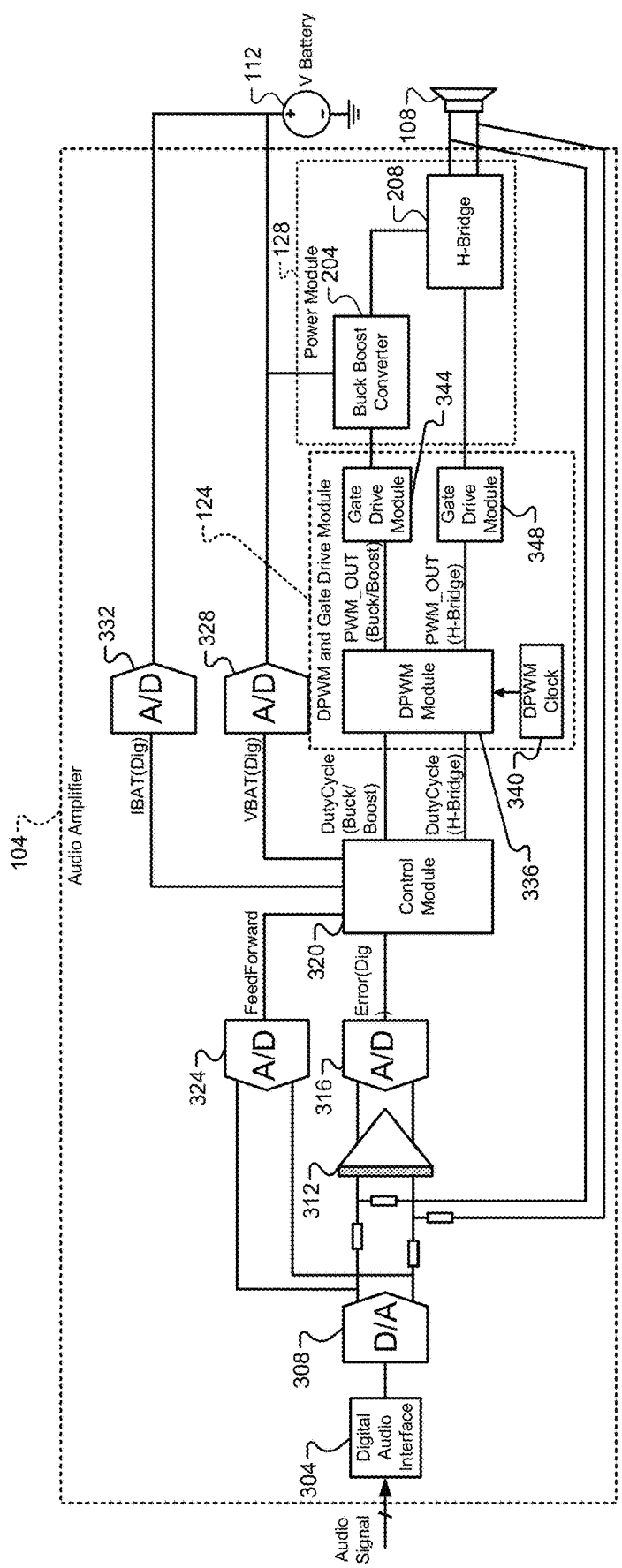
FIG. 3 is a functional block diagram of an audio amplifier.

FIG. 3 includes a functional block diagram of the audio amplifier 104. In the example of the audio input signal being a digital signal, a digital audio interface 304 may receive the input audio signal. A digital to analog (D/A) converter 308 converts the (digital) input audio signal into an analog signal and outputs the analog signal to an integrator comparator 312. In the example of the audio input signal being an analog signal, the D/A converter 308 may be omitted, and an analog audio interface may be used in place of the digital audio interface 304.

The integrator comparator 312 generates an analog error signal based on a difference between the analog signal and the (analog) output to the speaker 108 (at nodes N5 and N6). An analog to digital (A/D) converter 316 converts the analog error signal into a digitized error signal and outputs the error signal to a control module 320. A/D converter 324 converts the analog signal output by the D/A converter 308 into a digitized feed forward signal and outputs the feed forward signal to the control module 320.

A/D converter 328 converts the voltage of the battery 112 (at node N1) into a digitized battery voltage signal (VBat) and outputs the battery voltage signal to the control module 320. A/D converter 332 converts the current of the battery 112 (at node N1) into a digitized battery current signal (IBat) and outputs the battery current signal to the control module 320. The control module 320 generates duty cycle signals from the buck-boost converter 204 and the H-bridge 208 based on the error signal, the feed forward signal, the battery voltage signal, and the battery current signal.

A digital pulse width modulation (DPWM) module 336 converts the duty cycle signals for the buck-boost converter 204 into pulse width modulation (PWM) signals for switching of the first, second, third, and fourth FETs M1, M2, M3, and M4 of the buck-boost converter 204. A DPWM clock 340 generates a clock signal that is used to control the PWM signals. The DPWM clock 340 generates a pulse in the clock signal each predetermined period. A gate drive module 344 generates gate drive signals according to the PWM signals and applies the gate drive signals to the first, second, third, and fourth FETs M1, M2, M3, and M4 of the buck-boost converter 204.

The DPWM module 336 also converts the duty cycle signals for the H bridge 208 into PWM signals for switching of the fifth, sixth, seventh, and eighth FETs M5, M6, M7, and M8 of the H-bridge 208. The clock signal is also used to control the PWM signals for the H-bridge 208. A gate drive module 348 generates gate drive signals according to the PWM signals and applies the gate drive signals to the fifth, sixth, seventh, and eighth FETs M5, M6, M7, and M8 of the H-bridge 208.

Figure 4:
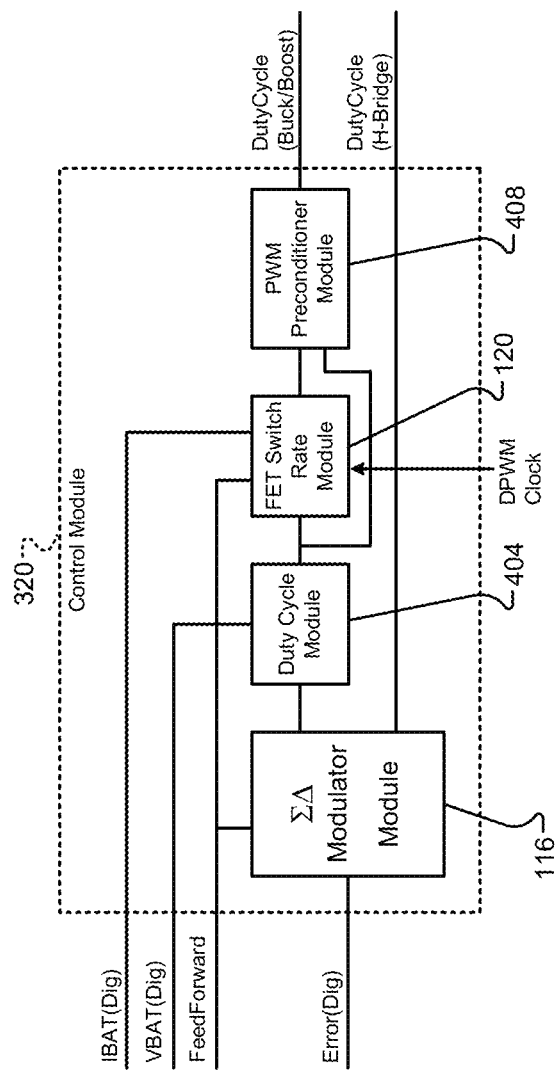
FIG. 4 is a functional block diagram of an example implementation of a control module.

FIG. 4 is a functional block diagram of an example implementation of the control module 320. The control module 320 includes the Sigma-Delta (ΣΔ) modulator module 116, the FET switch rate module 120, a duty cycle module 404, and a PWM preconditioner module 408.

The sigma-delta modulator module 116 determines a first duty cycle signal for the buck-boost converter 204 based on the error signal and the feed forward signal. The sigma-delta modulator module 116 may determine the first duty cycle signal, for example, using one of a lookup table and an equation that relates error values and feed forward values to first duty cycle values. The first duty cycle signal is not scaled to account for the battery voltage.

The sigma-delta modulator module 116 also determines the duty cycle signal for the H-bridge 208 based on the error signal and the feed forward signal. The sigma-delta modulator module 116 may determine the duty cycle signal for the H-bridge, for example, using one of a lookup table and an equation that relates error values and feed forward values to duty cycle values.

The duty cycle module 404 determines a second duty cycle signal based on the first duty cycle signal and the battery voltage signal. The duty cycle module 404 may determine the second duty cycle signal, for example, using one of a lookup table and an equation that relates first duty cycle values and battery voltage values to duty cycle values. The duty cycle module 404 may, for example, set the second duty cycle signal to greater than the first duty cycle signal as the battery voltage decreases below a predetermined voltage. The duty cycle module 404 may set the second duty cycle signal to less than the first duty cycle signal as the battery voltage increases above the predetermined voltage. The duty cycle module 404 scales the first duty cycle signal based on the battery voltage to produce the second duty cycle signal.

The FET switch rate module 120 selectively generates a start signal. The DPWM module 336 starts and resets a counter value each time the start signal is generated. The FET switch rate module 120 generates the start signal at a predetermined rate (corresponding to a predetermined frequency) multiplied by a scalar. The scalar is greater than or equal to 1. The FET switch rate module 120 determines the scalar based on the second duty cycle signal, the feed forward signal, and the battery current signal.

Figure 5:
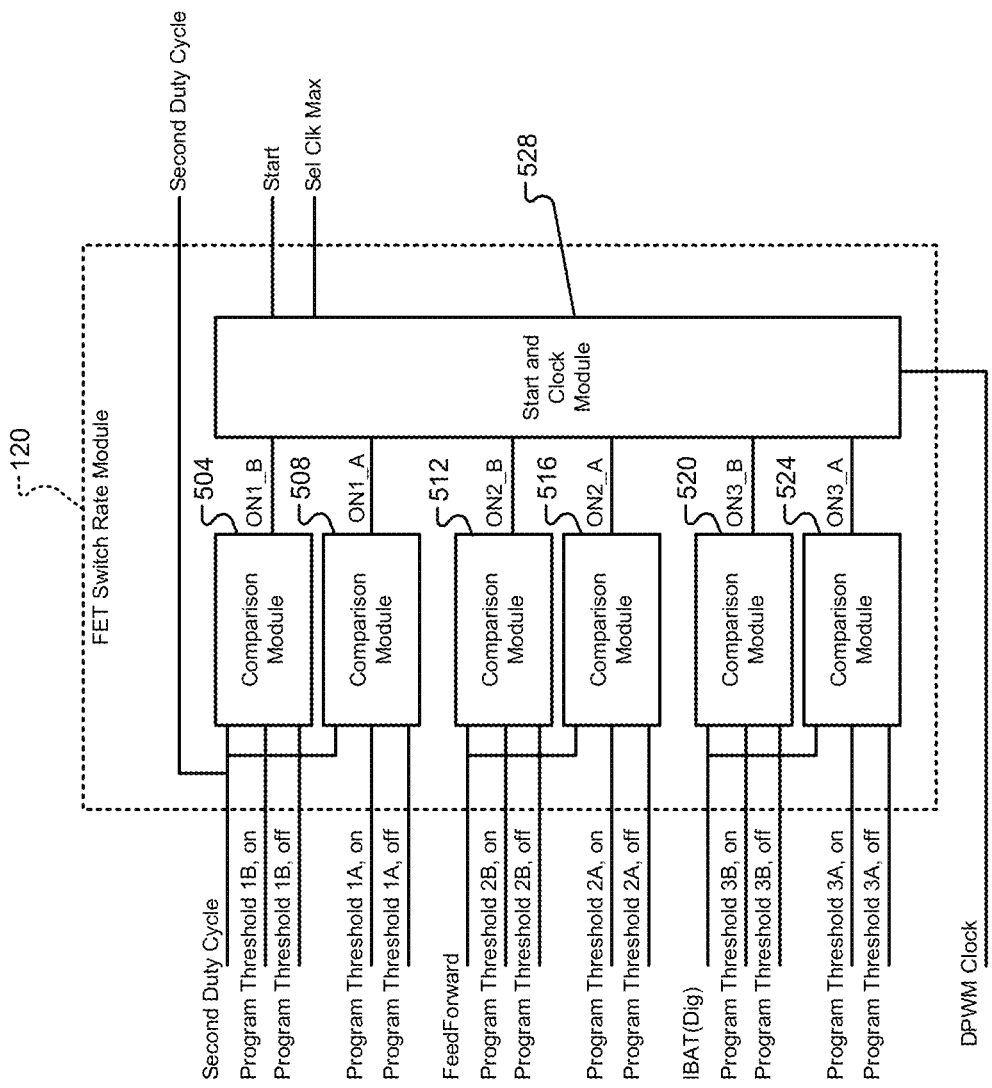
FIG. 5 is a functional block diagram of an example implementation of a FET switch rate module.

FIG. 5 includes a functional block diagram of an example implementation of the FET switch rate module 120. A first comparison module 504 compares the second duty cycle signal with a first predetermined duty cycle (program threshold 1b, on) and compares the second duty cycle signal with a second predetermined duty cycle (program threshold 1b, off). The first comparison module 504 sets a first comparison signal (On1_B) based on the comparisons. The first predetermined duty cycle is greater than the second predetermined duty cycle. The first comparison module 504 may set the first comparison signal to a first state when the second duty cycle signal is greater than the first predetermined duty cycle. The first comparison module 504 then maintains the first comparison signal in the first state until the second duty cycle signal becomes less than the second predetermined duty cycle. When the second duty cycle signal becomes less than the second predetermined duty cycle, the first comparison module 504 transitions the first comparison signal from the first state to a second state. The first comparison module 504 then maintains the first comparison signal in the second state until the second duty cycle signal becomes greater than the first predetermined duty cycle.

A second comparison module 508 compares the second duty cycle signal with a third predetermined duty cycle (program threshold 1*a*, on) and compares the second duty cycle signal with a fourth predetermined duty cycle (program threshold 1*a*, off). The second comparison module 508 sets a second comparison signal (On1_A) based on the comparisons. The third predetermined duty cycle is greater than the fourth predetermined duty cycle, and the fourth predetermined duty cycle is greater than the second predetermined duty cycle. The second comparison module 508 may set the second comparison signal to a first state when the second duty cycle signal is greater than the third predetermined duty cycle. The second comparison module 508 then maintains the second comparison signal in the first state until the second duty cycle signal becomes less than the fourth predetermined duty cycle. When the second duty cycle signal becomes less than the fourth predetermined duty cycle, the second comparison module 508 transitions the second comparison signal from the first state to a second state. The second comparison module 508 then maintains the second comparison signal in the second state until the second duty cycle signal becomes greater than the third predetermined duty cycle.

The first-fourth predetermined duty cycles may be programmable and may be accessible through an interface, such as an I2C (inter-integrated circuit) interface or another suitable type of interface.

A third comparison module 512 compares the feed forward signal with a first predetermined voltage (program threshold 2*b*, on) and compares the feed forward signal with a second predetermined voltage (program threshold 2*b*, off). The third comparison module 512 sets a third comparison signal (On2_B) based on the comparisons. The first predetermined voltage is greater than the second predetermined voltage. The third comparison module 512 may set the third comparison signal to a first state when the feed forward signal is greater than the first predetermined voltage. The third comparison module 512 then maintains the third comparison signal in the first state until the feed forward signal becomes less than the second predetermined voltage. When the feed forward signal becomes less than the second predetermined voltage, the third comparison module 512 transitions the third comparison signal from the first state to a second state. The third comparison module 512 then maintains the third comparison signal in the second state until the feed forward signal becomes greater than the first predetermined voltage.

A fourth comparison module 516 compares the feed forward signal with a third predetermined voltage (program threshold 2*a*, on) and compares the feed forward signal with a fourth predetermined voltage (program threshold 2*a*, off). The fourth comparison module 516 sets a fourth comparison signal (On2_A) based on the comparisons. The third predetermined voltage is greater than the fourth predetermined voltage, and the fourth predetermined voltage is greater than the second predetermined voltage. The fourth comparison module 516 may set the fourth comparison signal to a first state when the feed forward signal is greater than the third predetermined voltage. The fourth comparison module 516 then maintains the fourth comparison signal in the first state until the feed forward signal becomes less than the fourth predetermined voltage. When the feed forward signal becomes less than the fourth predetermined voltage, the fourth comparison module 516 transitions the fourth comparison signal from the first state to a second state. The fourth comparison module 516 then maintains the fourth comparison signal in the second state until the feed forward signal becomes greater than the third predetermined voltage.

The first-fourth predetermined voltages may be programmable and may be accessible through an interface, such as an I2C interface or another suitable type of interface.

A fifth comparison module 520 compares the battery current signal with a first predetermined current (program threshold 3*b*, on) and compares the battery current signal with a second predetermined current (program threshold 3*b*, off). The fifth comparison module 520 sets a fifth comparison signal (On3_B) based on the comparisons. The first predetermined current is greater than the second predetermined current. The fifth comparison module 520 may set the fifth comparison signal to a first state when the battery current signal is greater than the first predetermined current. The fifth comparison module 520 then maintains the fifth comparison signal in the first state until the battery current signal becomes less than the second predetermined current. When the battery current signal becomes less than the second predetermined current, the fifth comparison module 520 transitions the fifth comparison signal from the first state to a second state. The fifth comparison module 520 then maintains the fifth comparison signal in the second state until the battery current signal becomes greater than the first predetermined current.

A sixth comparison module 524 compares the battery current signal with a third predetermined current (program threshold 3*a*, on) and compares the battery current signal with a fourth predetermined current (program threshold 3*a*, off). The sixth comparison module 524 sets a sixth comparison signal (On3_A) based on the comparisons. The third predetermined current is greater than the fourth predetermined current, and the fourth predetermined current is greater than the second predetermined current. The sixth comparison module 524 may set the sixth comparison signal to a first state when the battery current signal is greater than the third predetermined current. The sixth comparison module 524 then maintains the sixth comparison signal in the first state until the battery current signal becomes less than the fourth predetermined voltage. When the battery current signal becomes less than the fourth predetermined current, the sixth comparison module 524 transitions the sixth comparison signal from the first state to a second state. The sixth comparison module 524 then maintains the sixth comparison signal in the second state until the battery current signal becomes greater than the third predetermined current.

The first-fourth predetermined currents may be programmable and may be accessible through an interface, such as an I2C interface or another suitable type of interface.

While the examples of duty cycle, battery current, and feedforward voltage are discussed, one or more other parameters may be used additionally or alternatively. For example output voltage at nodes N5 and N6 may be used. The battery current may be instantaneous, as discussed above, or an average (e.g., root mean squared, RMS).

A start and clock module 528 determines the scalar based on the first, second, third, fourth, fifth, and sixth comparison signals. For example, the start and clock module 528 may set the scalar to 1 when all of the first, second, third, fourth, fifth, and sixth comparison signals are in the second state. The start and clock module 528 may set the scalar to 2 when both: (a) at least one of the first, third, and fifth comparison signals are in the first state; and (b) all of the second, fourth, and sixth comparison signals are in the second state. The start and clock module 528 may set the scalar to 4 when at least one of: (a) both the first and second comparison signals are in the first state; (b) both the third and fourth comparison signals are in the first state; and (c) both the fifth and sixth comparison signals are in the first state. The start and clock module 528 generates the start signal at a rate equal to the predetermined rate multiplied by scalar. While the example of the scalar being 1, 2, or 4 is provided, other values may be used. The scalar may be an integer or a real number that is greater than or equal to 1.

The start and clock module 528 also sets a selection signal (Sel Clk Max) based on the first, second, third, fourth, fifth, and sixth comparison signals. For example, the start and clock module 528 may set the selection signal to a first state when all of the first, second, third, fourth, fifth, and sixth comparison signals are in the second state. The start and clock module 528 may set the selection signal to a second state when both: (a) at least one of the first, third, and fifth comparison signals are in the first state; and (b) all of the second, fourth, and sixth comparison signals are in the second state. The start and clock module 528 may set the selection signal to a third state when at least one of: (a) both the first and second comparison signals are in the first state; (b) both the third and fourth comparison signals are in the first state; and (c) both the fifth and sixth comparison signals are in the first state.

Referring back to FIG. 4, based on the selection signal (Sel Clk Max), the PWM preconditioner module 408 sets the duty cycle signal equal to the second duty cycle signal, the second duty cycle signal divided by 2, or the second duty cycle signal divided by 4.

Figure 6:
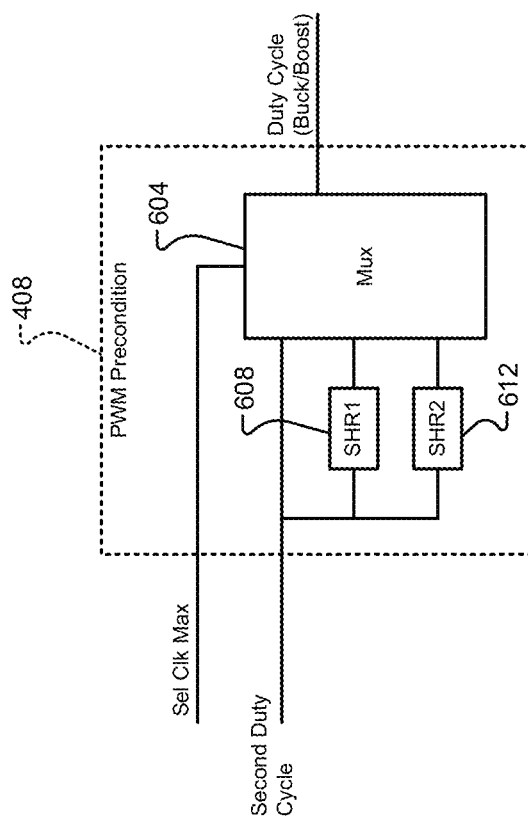
FIG. 6 is a functional block diagram of an example implementation of a PWM preconditioner module.

FIG. 6 includes a functional block diagram of an example implementation of the PWM preconditioner module 408. A multiplexer (Mux) 604 may include a three input, one output multiplexer. The multiplexer 604 may receive the second duty cycle signal at a first input, the second duty cycle divided by 2 at a second input, and the second duty cycle divided by 4 at a third input. A first shift register (SHR1) 608 may shift the second duty cycle to the right by one bit to divide the second duty cycle signal by 2 and provide the second duty cycle divided by 2 to the multiplexer 604. A second shift register (SHR2) 612 may shift the second duty cycle to the right by two bits to divide the second duty cycle signal by 4 and provide the second duty cycle divided by 4 to the multiplexer 604.

When the selection signal is in the first state, the multiplexer 604 outputs the second duty cycle signal as the duty cycle signal for the buck-boost converter 204. When the selection signal is in the second state, the multiplexer 604 outputs the second duty cycle signal divided by 2 as the duty cycle signal for the buck-boost converter 204. When the selection signal is in the third state, the multiplexer 604 outputs the second duty cycle signal divided by 4 as the duty cycle signal for the buck-boost converter 204.

Figure 7:
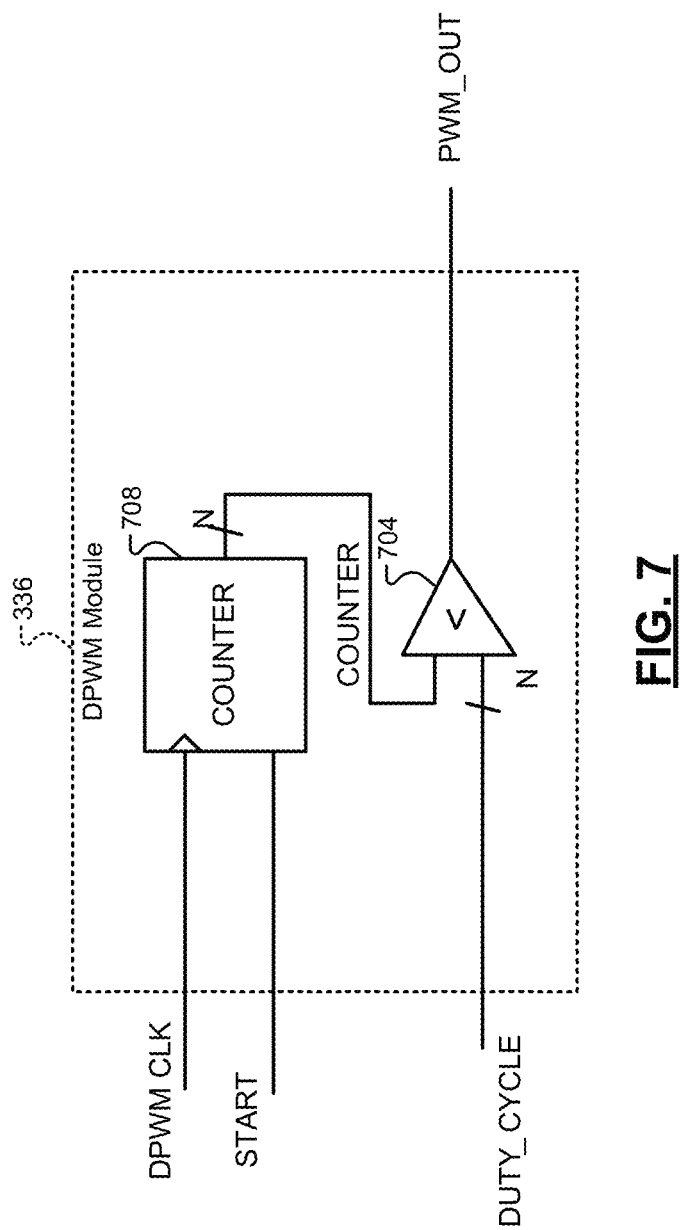
FIG. 7 is a functional block diagram of an example implementation of a DPWM module.

FIG. 7 is a functional block diagram of an example implementation of the DPWM module 336. A comparator module 704 generates the PWM signal based on a comparison of the duty cycle signal (output by the multiplexer 604) with a counter. More specifically, the comparator module 704 sets the PWM signal to a first state (for a FET being ON) when a counter value (counter) is less than the second duty cycle signal. The comparator module 704 sets the PWM signal to a second state (for the FET being OFF) when the counter value is not less than the second duty cycle signal.

A counter 708 resets the counter value to zero each time that the start signal is generated. The counter 708 increments the counter value each time that the DPWM clock signal is generated.

Figure 8:
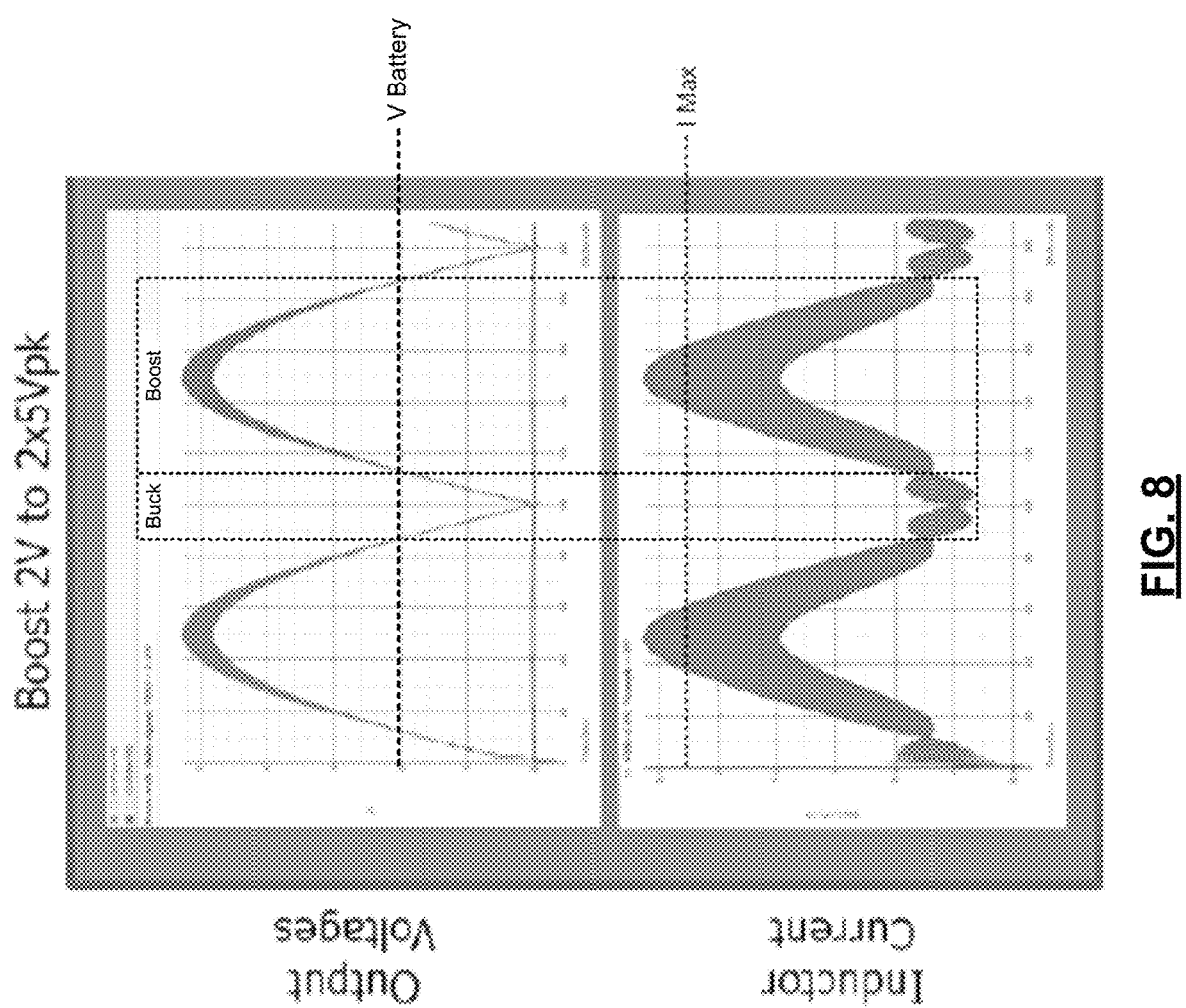
FIG. 8 includes an example graph of inductor current and output voltage.
Figure 9:
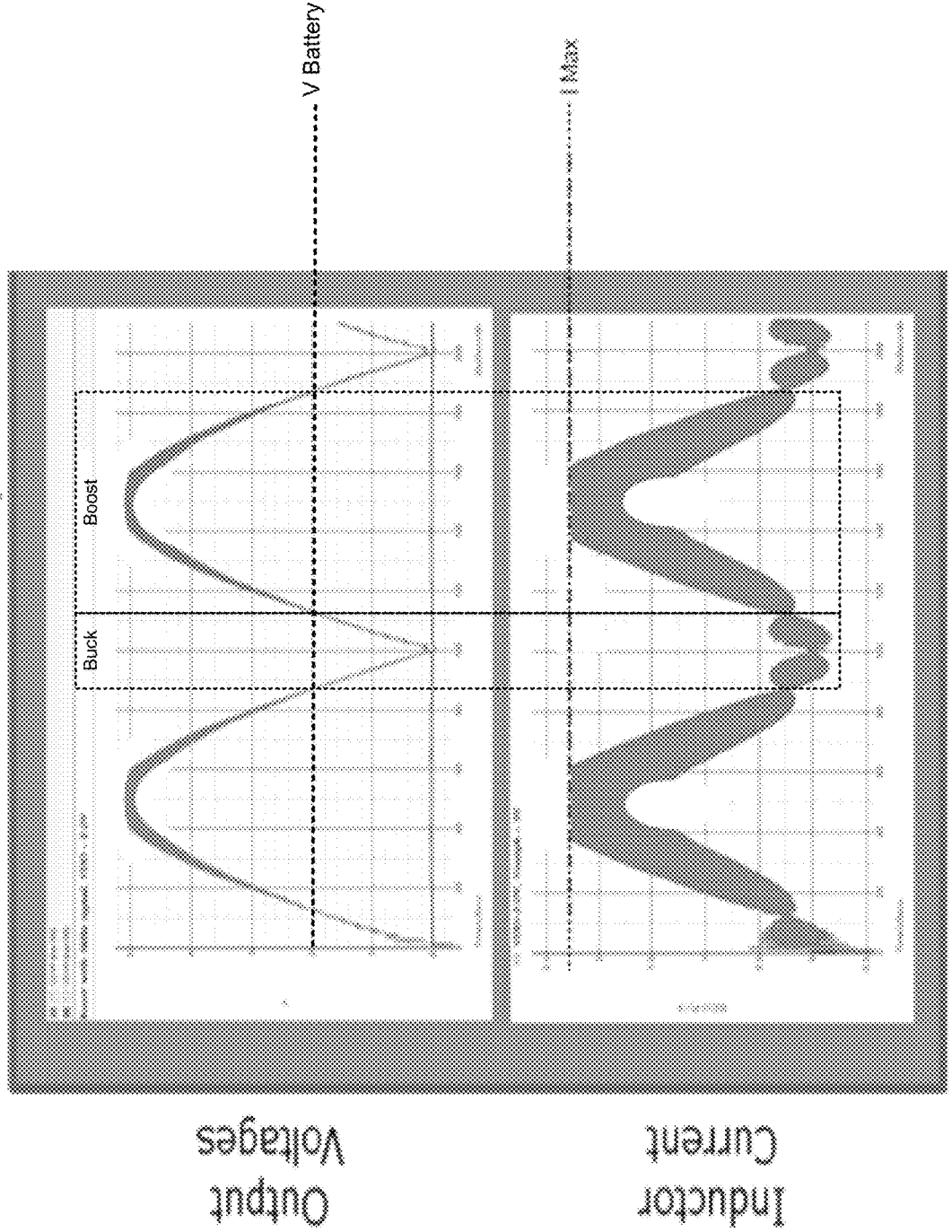
FIG. 9 includes an example graph of inductor current and output voltage.

FIG. 8 includes an example graph of inductor current and output voltage (at node N4) if the scalar was always equal to 1 and the second duty cycle signal was always used as the duty cycle for the buck-boost converter 204. FIG. 9 includes an example graph of inductor current and output voltage (at node N4) resulting from the use of the scalar value and adjusting the duty cycle, as described above. As illustrated, the use of the scalar and the adjusting of the duty cycle decreases ripple in the output voltage (at node N4) and decreases ripple in the inductor current.

Figure 10:
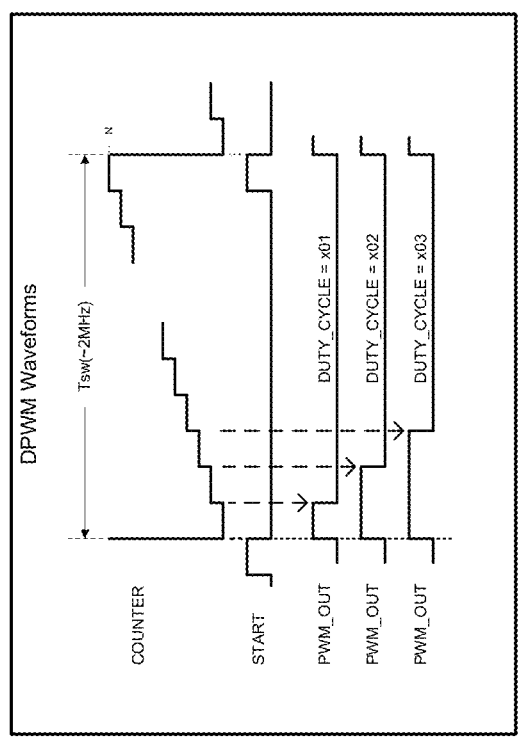
FIG. 10 includes an example graph of counter values, a start signal, and different PWM output signals generated based on a second duty cycle being divided differently.

FIG. 10 includes an example graph of counter values, the start signal, and different PWM output signals generated based on the second duty cycle being divided differently.

Figure 11:
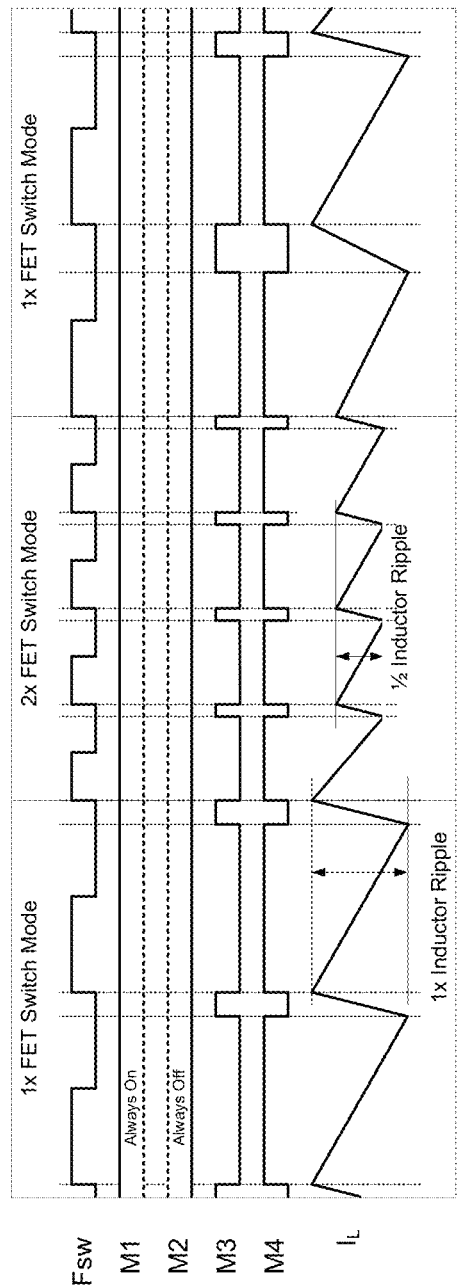
FIG. 11 includes an example graph of switching frequency (Fsw), states of first-fourth FETs, and inductor current for boost mode operation of a buck-boost converter.
Figure 12:
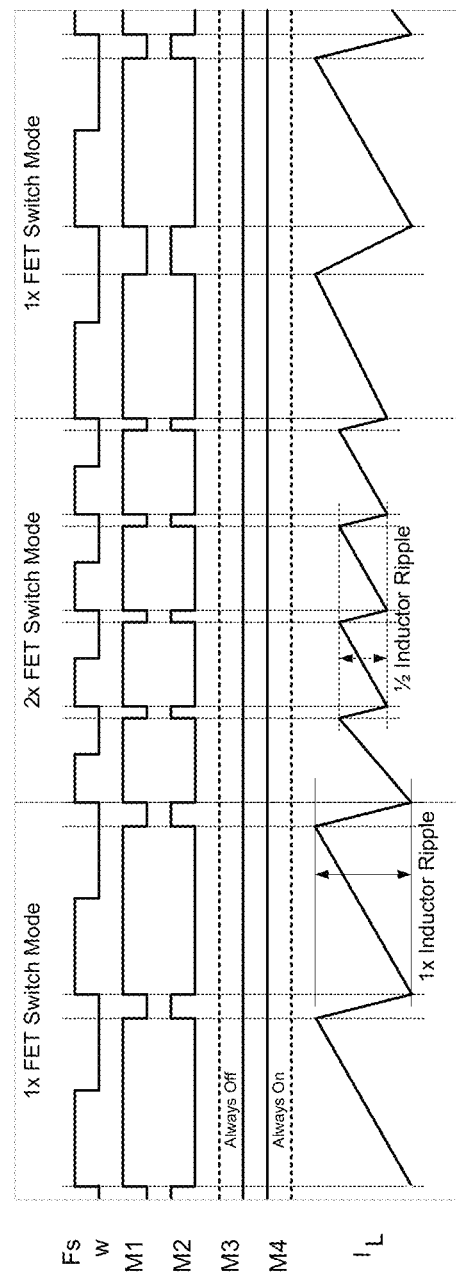
FIG. 12 includes an example graph of switching frequency (Fsw), states of the first-fourth FETs, and inductor current for buck mode operation of a buck-boost converter.

FIG. 11 includes an example graph of switching frequency (Fsw), states of the first-fourth FETs M1-M4, and inductor current for boost mode operation of the buck-boost converter 204. FIG. 12 includes an example graph of switching frequency (Fsw), states of the first-fourth FETs M1-M4, and inductor current for buck mode operation of the buck-boost converter 204. The scalar is 1 during the 1×FET Switch mode, and the scalar is 2 during the 2×FET Switch mode. Thus, the start signal will be generated twice as often, and the second duty cycle divided by 2 will be used as the duty cycle during the 2×FET switch mode. The scalar is 4 during the 4×FET Switch mode. Thus, the start signal will be generated four times as often, and the second duty cycle (number of counts) divided by 4 will be used as the duty cycle during the 4×FET switch mode. As illustrated, peak to peak inductor current ripple is reduced by operating in the 2×FET Switch mode.

Figure 13:
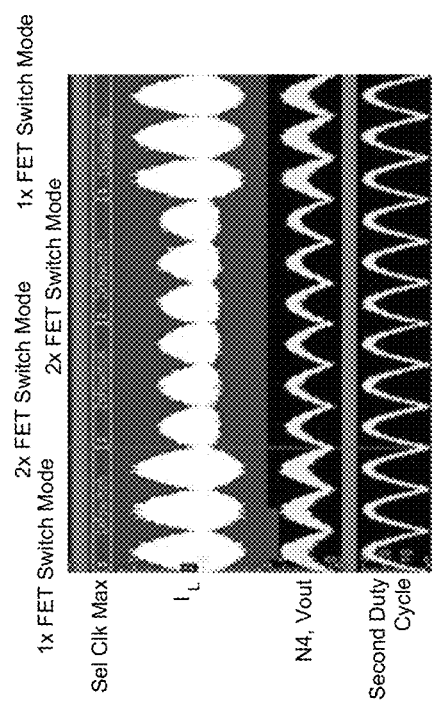
FIG. 13 includes example graphs of a selection signal, inductor current, output voltage, and duty cycle.

FIG. 13 includes example graphs of the selection signal, inductor current, output voltage (at Node N4), and duty cycle. As illustrated, peak to peak inductor current ripple and peak to peak output voltage ripple is reduced by operating in the 2×FET Switch mode.

Figure 14:
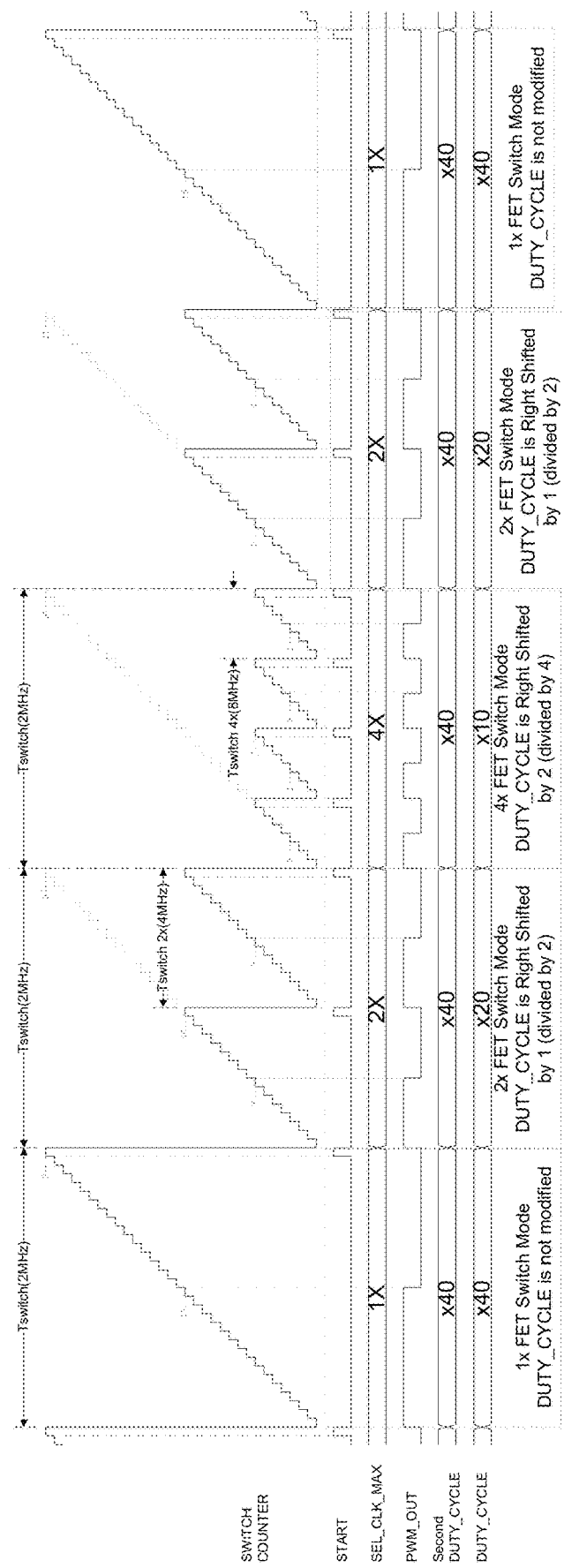
FIG. 14 includes an example graph of counter values, states of a start signal, states of a selection signal, PWM output signals, a second duty cycle signal, and a duty cycle signal.

FIG. 14 includes an example graph of counter values, states of the start signal, states of the selection signal, PWM output signals, the second duty cycle signal, and the duty cycle signal (as output by the multiplexer 604).

Figure 15:
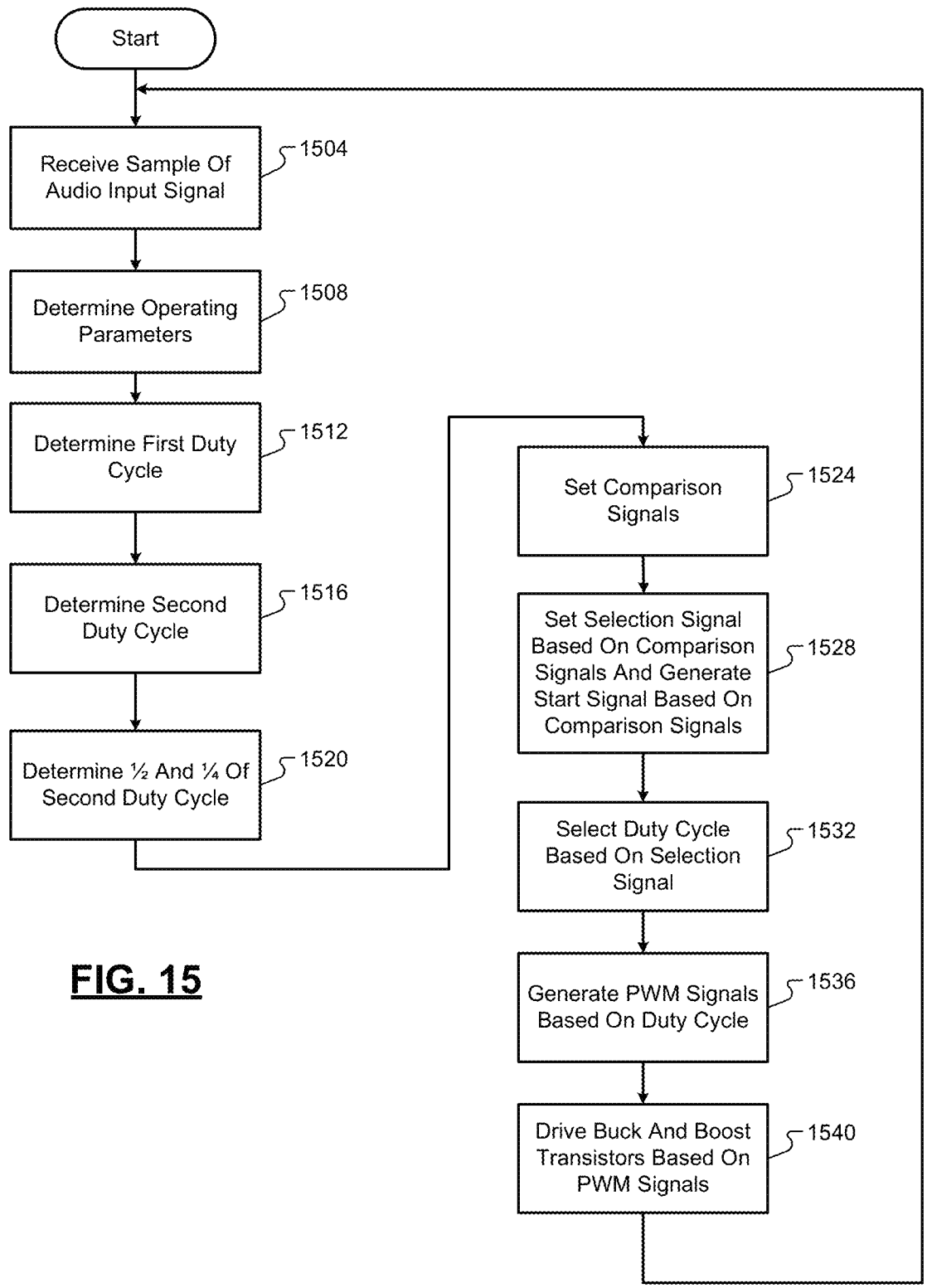
FIG. 15 includes a flowchart depicting an example method of controlling switching of the FETs of a buck-boost converter.

FIG. 15 includes a flowchart depicting an example method of controlling switching of the FETs of the buck-boost converter 204. The scalar may be initialized to 1 in various implementations. At 1504, the control module 320 receives a sample of the error signal. At 1508, the control module 320 receives or determines the operating parameters, such as the feed forward signal and the battery current.

At 1512, the sigma delta modulator module 116 determines the first duty cycle signal, as discussed above. At 1516, the duty cycle module 404 determines the second duty cycle signal, as discussed above. At 1520, the first shift register 608 shifts the second duty cycle signal to the right by 1 bit to produce a duty cycle that is equal to one-half of the second duty cycle signal (i.e., the second duty cycle signal divided by 2). The second shift register 612 shifts the second duty cycle signal to the right by 2 bits to produce a duty cycle that is equal to one-fourth of the second duty cycle signal (i.e., the second duty cycle signal divided by 4).

At 1524, the first-sixth comparison modules 504-524 set the states of the first-sixth comparison signals, as discussed above. At 1528, the start and clock module 528 generates the selection signal based on the first-sixth comparison signals. The start and clock module 528 also determines the scalar based on the first-sixth comparison signals and generates the start signals at a rate equal to the predetermined rate multiplied by the scalar.

At 1532, the multiplexer 604 selects the second duty cycle signal, ½ of the second duty cycle signal, or ¼ of the second duty cycle signal as the duty cycle signal for the buck-boost converter 204. When the scalar is 1, the second duty cycle signal will be selected. When the scalar is 2, ½ of the second duty cycle signal will be selected. When the scalar is 4, ¼ of the second duty cycle signal will be selected.

At 1536, the DPWM module 336 generates the PWM signals for the FETs of the buck-boost converter 204 based on the duty cycle output from the multiplexer 604 and the start signal. At 1540, the gate drive module 344 applies signals to the gates of the FETs of the buck-boost converter 204 based on the PWM signals output by the DPWM module 336. Control returns to 1504 for a next sample.

Figure 16:
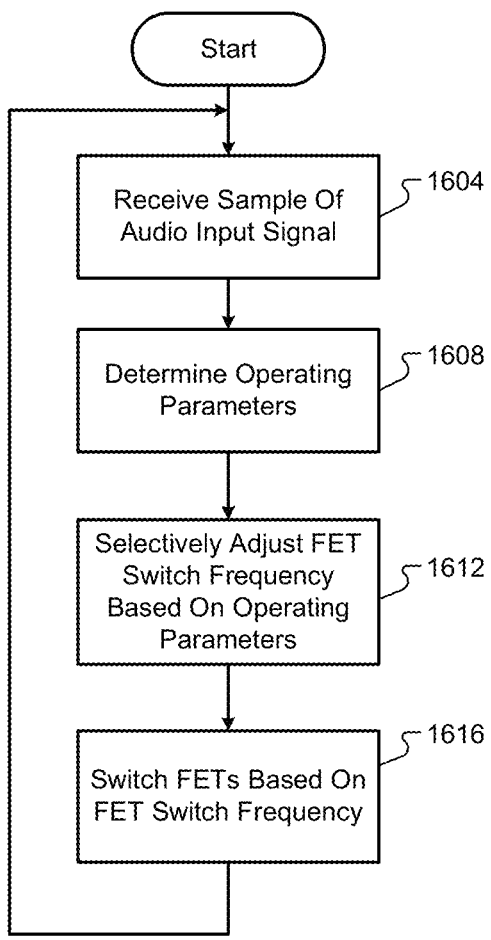
FIG. 16 includes a flowchart depicting an example method of controlling switching of the FETs of a buck-boost converter.

FIG. 16 includes a flowchart depicting an example method of controlling switching of the FETs of the buck-boost converter 204. The scalar may be initialized to 1 in various implementations. At 1604, the control module 320 receives a sample of the error signal. At 1608, the control module 320 receives or determines the operating parameters, such as the feed forward signal and the battery current.

At 1612, the control module 320 selectively adjusts the FET switch frequency based on one or more of the operating parameters. For example, the control module 320 may increase the scalar (away from 1) as at least one of: the battery current increases; the amplitude of the input signal increases; and the second duty cycle increases. The control module 320 may decrease the scalar toward (or to) 1 as at least one of: the battery current decreases; the amplitude of the input signal decreases; and the second duty cycle decreases. The control module 320 may multiply the scalar with the predetermined rate (corresponding to the predetermined frequency). At 1616, the DPWM and gate drive module 124 drives the FETs of the buck-boost converter 204 based on the FET switch frequency.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. An amplifier system, comprising:
a voltage converter including at least one of:
a buck converter; and
a boost converter;
a first module configured to, based on an input sample, determine a first switching rate for switching field effect transistors (FETs) of the voltage converter;
a second module configured to, based on a battery voltage and the first switching rate, determine a second switching rate for switching the FETs of the voltage converter;
a third module configured to generate a third switching rate of the FETs of the voltage converter based on the second switching rate and at least one of a battery current and an amplitude of the input sample;
a fourth module configured to generate a switching output for switching of the FETs of the voltage converter based on the third switching rate; and
a fifth module configured to apply power to gate terminals of the FETs of the voltage converter based on the switching output.

2. The amplifier system of claim 1 wherein the third module is configured to set the third switching rate to the second switching rate when all of:
the battery current is less than a predetermined current; and
the amplitude of the input sample is less than a predetermined voltage.

3. The amplifier system of claim 2 wherein the third module is configured to set the third switching rate to greater than the second switching rate when the battery current is greater than the predetermined current.

4. The amplifier system of claim 3 wherein the third module is configured to set the third switching rate to at least twice the second switching rate when the battery current is greater than a second predetermined current that is greater than the predetermined current.

5. The amplifier system of claim 3 wherein the third module is configured to transition the third switching rate from greater than the second switching rate to the second switching rate when the battery current transitions from greater than a second predetermined current to less than the second predetermined current, wherein the second predetermined current is less than the predetermined current.

6. The amplifier system of claim 2 wherein the third module is configured to set the third switching rate to greater than the second switching rate when the amplitude of the input sample is greater than the predetermined voltage.

7. The amplifier system of claim 6 wherein the third module is configured to set the third switching rate to at least twice the second switching rate when the amplitude of the input sample is greater than a second predetermined voltage that is greater than the predetermined voltage.

8. The amplifier system of claim 6 wherein the third module is configured to transition the third switching rate from greater than the second switching rate to the second switching rate when the amplitude of the input sample transitions from greater than a second predetermined voltage to less than the second predetermined voltage, wherein the second predetermined voltage is less than the predetermined voltage.

9. The amplifier system of claim 2 wherein the third module is configured to set the third switching rate to greater than the second switching rate when the second switching rate is greater than a predetermined switching rate.

10. The amplifier system of claim 9 wherein the third module is configured to set the third switching rate to at least twice the second switching rate when the second switching rate is greater than a second predetermined switching rate that is greater than the predetermined switching rate.

11. The amplifier system of claim 9 wherein the third module is configured to transition the third switching rate from greater than the second switching rate to the second switching rate when the second switching rate transitions from greater than a second predetermined switching rate to less than the second predetermined switching rate, wherein the second predetermined switching rate is less than the predetermined switching rate.

12. The amplifier system of claim 1 wherein the third module is configured to set the third switching rate based on all of the battery current, the amplitude of the input sample, and the second switching rate.

13. The amplifier system of claim 1 wherein the third module is configured to transition the third switching rate to greater than the second switching rate when at least one of:

the battery current is greater than a first predetermined current;

the amplitude of the input sample is greater than a first predetermined voltage; and the second switching rate is greater than a first predetermined switching rate.

14. The amplifier system of claim 13 wherein the third module is configured to transition the third switching rate to at least twice the second switching rate when at least one of:

the battery current is greater than a second predetermined current that is greater than the first predetermined current;

the amplitude of the input sample is greater than a second predetermined voltage that is greater than the first predetermined voltage; and the second switching rate is greater than a second predetermined switching rate that is greater than the first predetermined switching rate.

15. The amplifier system of claim 1 further comprising:
a speaker; and
an H-bridge configured to receive output from the voltage converter and to apply power to the speaker.

16. An amplifier system, comprising:
a voltage converter including at least one of:
a buck converter; and
a boost converter;
a power stage configured to receive power output from the voltage converter and to apply power to a load;
a control module configured to set a switching rate for field effect transistors (FETs) of the voltage converter based on one or more operating parameters;
a digital pulse width modulation (DPWM) module configured to generate a pulse width modulation (PWM) output for switching of the FETs of the voltage converter based on the switching rate; and
a gate drive module configured to apply power to gate terminals of the FETs of the voltage converter based on the PWM output.

17. The amplifier system of claim 16 wherein the control module is configured to at least one of:
increase the switching rate as a battery current increases; and
decrease the switching rate as the battery current decreases.

18. The amplifier system of claim 16 wherein the control module is configured to at least one of:
increase the switching rate as an amplitude of an input sample increases; and
decrease the switching rate as the amplitude of the input sample decreases.

19. The amplifier system of claim 16 wherein the control module is configured to determine the switching rate based on a second switching rate and to at least one of:
increase the switching rate as the second switching rate increases; and
decrease the switching rate as the second switching rate decreases.

20. A method, comprising:
based on an input sample, determining a first switching rate for switching field effect transistors (FETs) of a voltage converter, the voltage converter including at least one of:
a buck converter; and
a boost converter;
based on a battery voltage and the first switching rate, determining a second switching rate for switching the FETs of the voltage converter;
generating a third switching rate of the FETs of the voltage converter based on the second switching rate and at least one of a battery current and an amplitude of the input sample;
generating a switching output for switching of the FETs of the voltage converter based on the third switching rate; and
applying power to gate terminals of the FETs of the voltage converter based on the switching output.

* * * * *